(12) United States Patent
Mahooti et al.

(10) Patent No.: US 8,358,175 B2
(45) Date of Patent: Jan. 22, 2013

(54) OSCILLATOR ARCHITECTURE HAVING FAST RESPONSE TIME WITH LOW CURRENT CONSUMPTION AND METHOD FOR OPERATING THE OSCILLATOR ARCHITECTURE

(75) Inventors: Kevin Mahooti, Sunnyvale, CA (US); Sanket Gandhi, San Jose, CA (US); Min Ming Tarng, San Jose, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/104,361

(22) Filed: May 10, 2011

(65) Prior Publication Data

US 2012/0286881 A1 Nov. 15, 2012

(51) Int. Cl.
*H03B 27/00* (2006.01)

(52) U.S. Cl. .......................................... 331/47; 331/45

(58) Field of Classification Search .................. 331/47, 331/45, 160
See application file for complete search history.

(56) References Cited

U.S. PATENT DOCUMENTS

| | | | |
|---|---|---|---|
| 6,005,449 A | 12/1999 | Oberlin | |
| 6,774,735 B2 | 8/2004 | Senthikumar et al. | |
| 7,719,373 B2 * | 5/2010 | Ryckaert et al. | 331/173 |
| 2008/0143446 A1 * | 6/2008 | Yao et al. | 331/45 |

* cited by examiner

*Primary Examiner* — Joseph Chang

(57) ABSTRACT

An oscillator architecture and a method for powering up/down the oscillator architecture are described. In one embodiment, an oscillator architecture includes a reference generator configured to generate reference signals and an in-phase/quadrature (IQ) oscillator configured to generate oscillation signals based on the reference signals. The reference generator includes a distributed start-up circuitry that includes multiple start-up circuits. The IQ oscillator includes at least one turbo comparator having a low power functional mode and a turbo functional mode. Other embodiments are also described.

20 Claims, 13 Drawing Sheets

| MODE | VOLTAGE REFERENCE GENERATOR AND VOLTAGE BANK REFERENCE GENERATOR | CURRENT REFERENCE GENERATOR | IQ OSCILLATOR | CLK/CLKB |
|---|---|---|---|---|
| ACTIVE | POWER ON | POWER ON | POWER ON | NORMAL CLOCKING |
| STANDBY | POWER ON | POWER ON | POWER OFF | L/H |
| DOSE | POWER ON | POWER OFF | POWER OFF | L/H |
| SLEEP | POWER OFF | POWER OFF | POWER OFF | L/H |

FIG. 10

| MODE | TPD | PD | PD_OSC | I_total | I_Osc | I_bias | STARTUP TIME | FREQ SETTLING TIME | PEAK CURRENT |
|---|---|---|---|---|---|---|---|---|---|
| ACTIVE | L | L | L | 17.14μA | 8.79μA | 9.59μA | – | – | – |
| STANDBY | L | L | H | 5.16μA | 12.8nA | 5.15μA | 0.114μs | 0.81μs | 73.3μA |
| DOSE | L | H | (L) | 430nA | 13.7nA | 417nA | 1.232μs | 1.95μs | 106μA |
| SLEEP | H | (L) | (L) | 23.5nA | 11.94nA | 11.6nA | 0.382μs | 1.8μs | 158μA |

FIG. 12

OSCILLATOR ARCHITECTURE HAVING FAST RESPONSE TIME WITH LOW CURRENT CONSUMPTION AND METHOD FOR OPERATING THE OSCILLATOR ARCHITECTURE

Embodiments of the invention relate generally to electronic systems and methods for operating the electronic systems and, more particularly, to oscillator architectures and methods for operating the oscillator architectures.

In a highly accurate process/voltage/temperature compensated oscillator, accuracy of the oscillation is largely dependent on the accuracy of voltage/current reference generators of the oscillator and the delay of comparators of the oscillator. In addition, the response speed/delay of the oscillator is usually directly related to the response speed/delay of the reference generators and the comparators. For oscillators that are designed to generate accurate timings based on reference generators and comparators, a faster response time typically comes with higher current consumption in the reference generators and the comparators.

An oscillator architecture and a method for powering up/down the oscillator architecture are described. In one embodiment, an oscillator architecture includes a reference generator configured to generate reference signals and an in-phase/quadrature (IQ) oscillator configured to generate oscillation signals based on the reference signals. The reference generator includes a distributed start-up circuitry that includes multiple start-up circuits. The IQ oscillator includes at least one turbo comparator having a low power functional mode and a turbo functional mode. Other embodiments are also described.

In an embodiment, an oscillator architecture includes a reference generator and an IQ oscillator. The reference generator includes a voltage reference generator configured to generate a constant reference voltage, where the voltage reference generator includes a distributed start-up circuitry that includes multiple start-up circuits; a voltage bank reference generator configured to receive the constant reference voltage from the voltage reference generator and generate a bank of reference voltages; and a current reference generator configured to receive the bank of reference voltages from the voltage bank reference generator and generate a bias voltage and a reference current. The IQ oscillator is configured to generate oscillation signals based on the bias voltage and the reference current. The IQ oscillator includes a sawtooth generator configured to generate two output signals that have 180 degree phase shift; two turbo comparators having a low power functional mode and a turbo functional mode, where the two turbo comparators are configured to receive the two output signals from the sawtooth generator, and where the two turbo comparators are transconductance based comparators; and a set/reset logic configured to generate clock signals for the two turbo comparators.

In an embodiment, a method for sequentially powering up/down an oscillator architecture, where the oscillator architecture includes a reference generator and an IQ oscillator, where the reference generator includes a voltage reference generator including a distributed start-up circuitry that includes multiple start-up circuits, a voltage bank reference generator and a current reference generator, and where the IQ oscillator includes a sawtooth generator, two turbo comparators and a set/reset logic, includes powering up/down the voltage reference generator and the voltage bank reference generator first, powering up/down the current reference generator second, and powering up/down the IQ oscillator third.

Other aspects and advantages of embodiments of the present invention will become apparent from the following detailed description, taken in conjunction with the accompanying drawings, depicted by way of example of the principles of the invention.

FIG. 10 shows some examples of the properties of four power management modes of the oscillator architecture of FIG. 1.

FIG. 12 depicts exemplary parameters of the oscillator architecture of FIG. 1.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
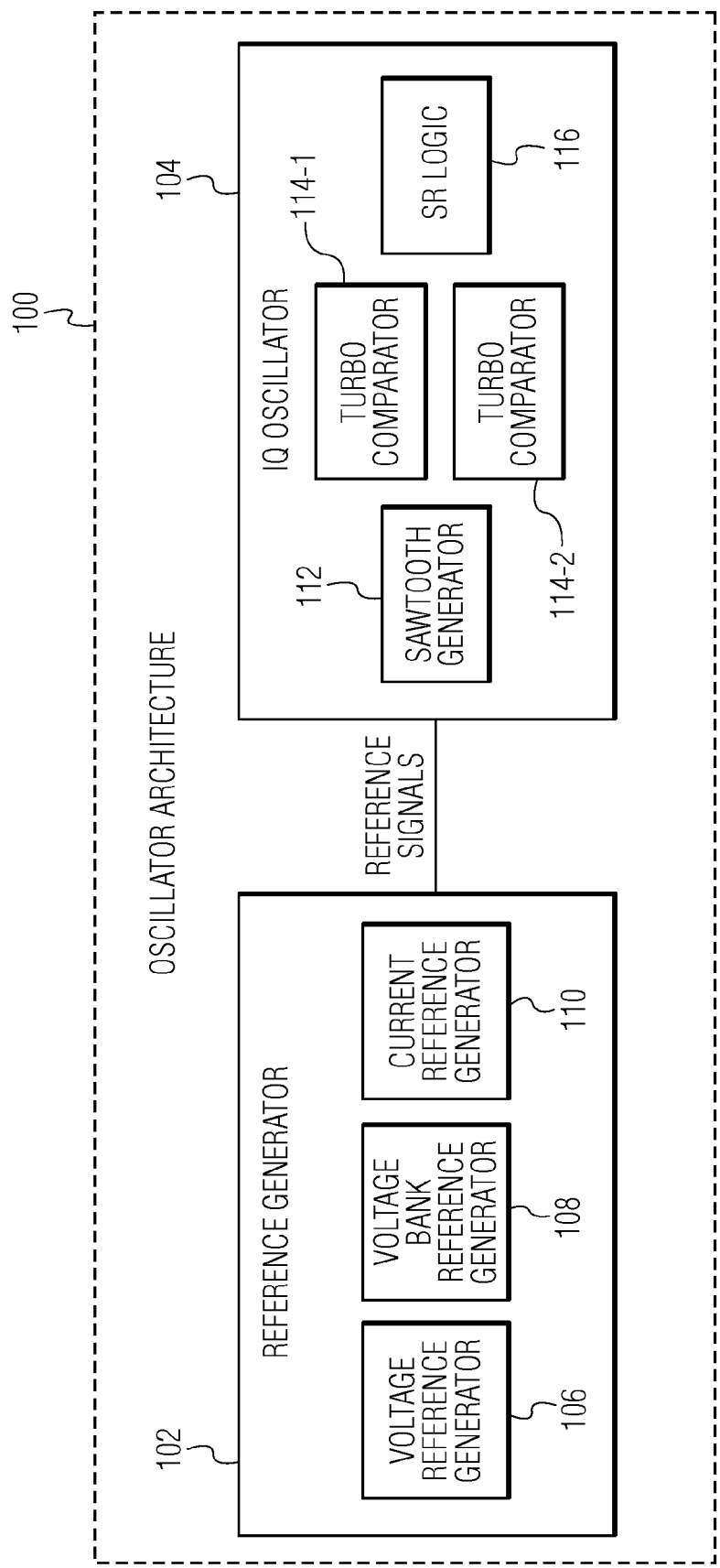
FIG. 1 is a schematic block diagram of an oscillator architecture in accordance with an embodiment of the invention.

FIG. 1 is a schematic block diagram of an oscillator architecture 100 in accordance with an embodiment of the invention. The oscillator architecture may be used for various devices and applications, such as computers, machineries and communications devices. The oscillator architecture may be implemented in a single circuit or distributed among multiple circuits. In an embodiment, the oscillator architecture is an oscillator Integrated Circuit (IC).

In the embodiment depicted in FIG. 1, the oscillator architecture 100 includes a reference generator 102 and an IQ oscillator 104. The reference generator is configured to generate reference signals. The IQ oscillator is configured to generate oscillation signals based on the reference signals.

The reference generator 102 of the oscillator architecture 100 includes a voltage reference generator 106, a voltage bank reference generator 108 and a current reference generator 110. The voltage reference generator is configured to generate a reference voltage. The voltage bank reference generator is configured to generate multiple reference voltages, for example, using the reference voltage from the voltage reference generator 106. The current reference generator is configured to generate a reference current, for example, using the reference voltages from the voltage bank reference generator 108.

Figure 2:
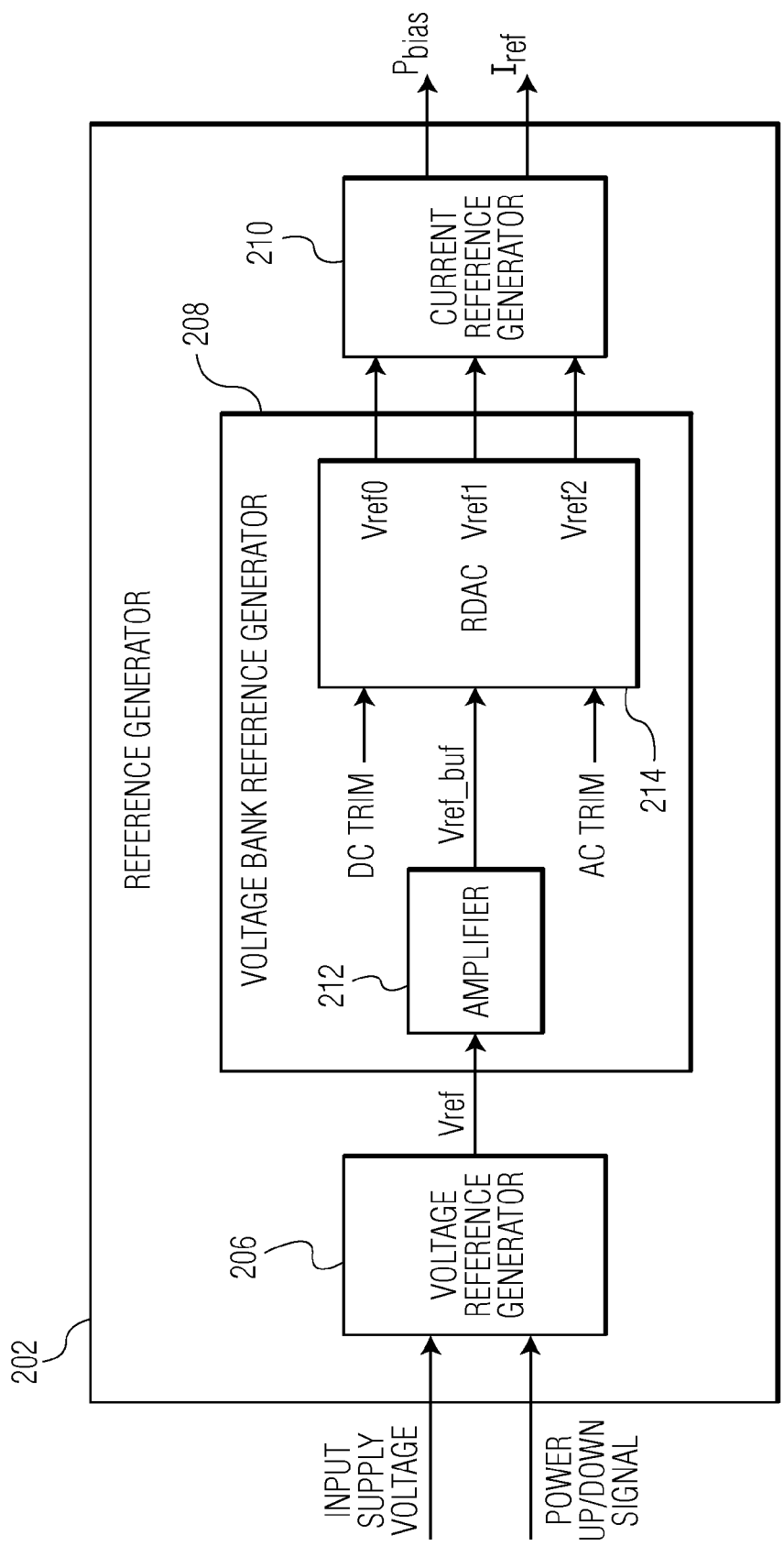
FIG. 2 depicts an embodiment of a reference generator included in the oscillator architecture of FIG. 1.

FIG. 2 depicts an embodiment of the reference generator 102 of FIG. 1. In the embodiment depicted in FIG. 2, a reference generator 202 includes a voltage reference generator 206, a voltage bank reference generator 208 and a current reference generator 210.

The voltage reference generator 206 of the reference generator 202 is configured to receive an input supply voltage and a power up/down signal and generate a constant reference voltage "$V_{ref}$." The power up/down signal is generated by a circuitry that uses the oscillator architecture 100. In an embodiment, the power up/down signal is generated by a circuit core or a central processing unit (CPU). A constant reference voltage is a reference voltage whose value is fixed and does not change over time. In an embodiment, the voltage reference generator 206 may include at least one start-up circuit, which can inject extra current during start-up of the oscillator architecture 100 to generate the reference voltage $V_{ref}$ within a predefined time period. For example, the start-up circuit can inject extra current during certain operational modes and/or transitions between certain operational modes of the oscillator architecture 100. In an embodiment, the start-up circuit injects extra current during Total Power Down (TPD) to active mode of the oscillator architecture 100 and Power Down (PD) to active mode of the oscillator architecture.

Figure 3:
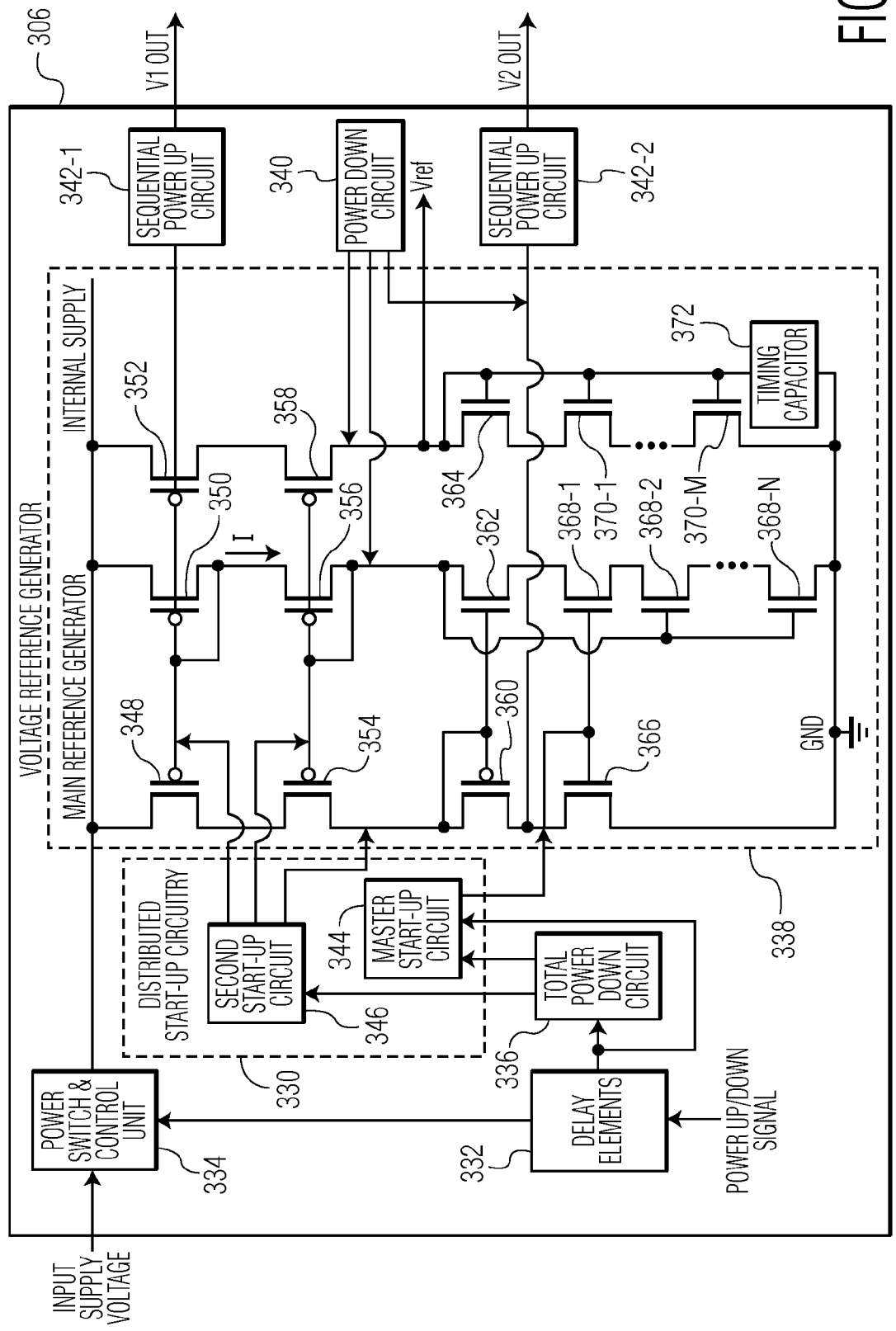
FIG. 3 depicts an embodiment of a voltage reference generator with a distributed start-up circuitry included in the reference generator of FIG. 2.

In an embodiment, the voltage reference generator 206 includes a distributed start-up circuitry, which includes more than one start-up circuit. The distributed start-up circuitry can increase the response speed of the oscillator architecture 100 and reduce the response delay of the oscillator architecture without increasing the current consumption of the voltage reference generator 206. An embodiment of the voltage reference generator 206 of FIG. 2 with a distributed start-up circuitry is depicted in FIG. 3. In the embodiment depicted in FIG. 3, a voltage reference generator 306 includes a distributed start-up circuitry 330, delay elements 332, a power switch and control unit 334, a Total Power Down (TPD) circuit 336, a main reference generator 338, a Power Down (PD) circuit 340 and sequential power up circuits 342-1, 342-2.

The distributed start-up circuitry 330 includes a master start-up circuit 344 and a second start-up circuit 346. The master start-up circuit receives instruction signals from the delay elements 332 and the TPD circuit 336 and injects a current to the main reference generator 338. The second start-up circuit receives an instruction signal from the TPD circuit and injects three currents to the main reference generator.

The delay elements 332 receives the power up/down signal and generate delayed power up/down signals, which are output to the power switch and control unit 334, the TPD circuit 336 and the master start-up circuit 344.

The power switch and control unit 334 receives the input supply voltage and the delayed power up/down signal from the delay elements 332 and selectively connects to an internal supply. In an embodiment, the power switch and control unit includes Complementary Metal Oxide Semiconductor (CMOS) switches that get turned on when the delayed power up/down signal to the power switch and control unit gets activated.

The TPD circuit 336 receives the delayed power up/down signal from the delay elements 332 and generates instruction signals, which are output to the master start-up circuit 344 and the second start-up circuit 346.

The main reference generator 338 receives input signals from the distributed start-up circuitry 330, the delay elements 332, the power switch and control unit 334, the TPD circuit 336 and the PD circuit 340 and generates the constant reference voltage $V_{ref}$, which is output to the voltage bank reference generator 208 (shown in FIG. 2). In addition, the main reference generator generates output signals to the sequential power up circuits 342-1, 342-2. In the embodiment depicted in FIG. 3, the main reference generator includes transistors 348-366, 368-1 ... 368-N, where N is an integer that is larger than two, 370-1 ... 370-M, where M is an integer that is larger than one, and a timing capacitor 372. The transistors 348, 354, 360, 366, which form a first branch of the main reference generator, and the transistors 350, 356, 362, 368-1 to 368-N, which form a second branch of the main reference generator, generate a current (I) proportional to Absolute Temperature (IPTAT). The current I is mirrored to the third branch of the main reference generator, which is formed by the transistors 352 and 358. The transistors 364 and 370-1 to 370-M generate a compensated reference voltage, which is the reference voltage $V_{ref}$.

The PD circuit 340 applies discharging signals to a node between the transistor 360 and the transistor 366, a node between the transistor 356 and the transistor 362, and a node between the transistor 358 and the transistor 364 to discharge the voltages across the first, second and third branches of the main reference generator 338, respectively. In an embodiment, the PD circuit receives an input signal that is generated from sequential signals for sequentially powering down the oscillator architecture 100 to generate the discharging signals. The sequential power up circuit 342-1 receives an output signal from the main reference generator and generates an output voltage "$V_{1out}$." The sequential power up circuit 342-2 receives output signals from the main reference generator and the PD circuit 340 and generates an output voltage "$V_{2out}$." The output voltages $V_{1out}$ and $V_{2out}$ are output to the voltage bank reference generator 208 (shown in FIG. 2).

Turning back to FIG. 2, the voltage bank reference generator 208 of the reference generator 202 is configured to receive the constant reference voltage $V_{ref}$ from the voltage reference generator 206 and generate a bank of reference voltages (e.g. "$V_{ref0}$," "$V_{ref1}$," and "$V_{ref2}$,"), which are output to the current reference generator 210, based on the constant reference voltage $V_{ref}$. In the embodiment depicted in FIG. 2, the voltage bank reference generator 208 includes an amplifier 212 and a Resistor String Digital-to-Analog Converter (RDAC) 214.

The amplifier 212 of the voltage bank reference generator 208 is configured to receive the constant reference voltage $V_{ref}$ from the voltage reference generator 206 and generates an output voltage "$V_{ref\_buf}$" to the RDAC 214. In an embodiment, the amplifier may be a unity gain amplifier, which holds the value of the constant reference voltage $V_{ref}$. In this embodiment, the value of the output voltage $V_{ref\_buf}$ is the same as the constant reference voltage $V_{ref}$.

The RDAC 214 of the voltage bank reference generator 208 is configured to receive the output voltage $V_{ref\_buf}$ and generate a bank of reference voltages (e.g. three reference voltages $V_{ref0}$, $V_{ref1}$ and $V_{ref2}$). The RDAC also receives DC and AC trim bits, which are used to set the values of the bank of reference voltages such as the reference voltages $V_{ref0}$, $V_{ref1}$ and $V_{ref2}$. The DC trim bits represent trim bits that are used to adjust the values of the bank of reference voltages for errors caused in the silicon fabrication process of the RDAC. In the silicon fabrication process, sometimes the silicon fabrication results are different from models and simulation results. In those cases, DC trim bits need to be used to set the silicon fabrication results to be close to the models and simulation results. The AC trim bits represent trim bits that are used to actively adjust the values of the bank of reference voltages. Typically, DC trimming is performed once and AC trimming is performed multiple times.

Figure 4:
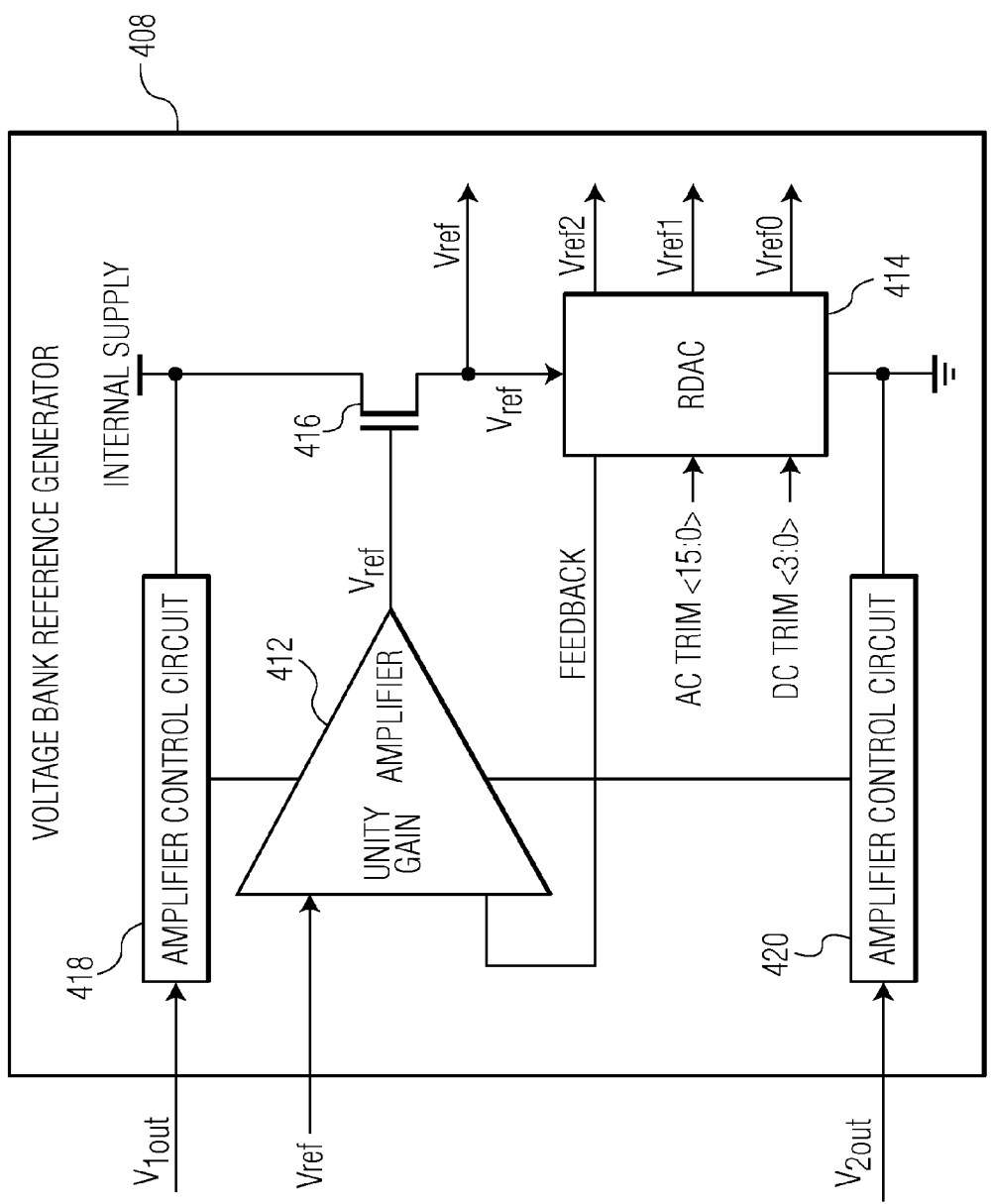
FIG. 4 depicts an embodiment of a voltage bank reference generator with a unity gain amplifier included in the reference generator of FIG. 2.

An embodiment of the voltage bank reference generator 208 of FIG. 2 with a unity gain amplifier 412 is depicted in FIG. 4. In the embodiment depicted in FIG. 4, a voltage bank reference generator 408 includes the unity gain amplifier 412, an RDAC 414, a switch transistor 416 and amplifier control circuits 418 and 420.

The unity gain amplifier 412 is controlled by the amplifier control circuits 418 and 420 to generate an output voltage of the same value as the constant reference voltage $V_{ref}$. The switch transistor 416 is connected to the unity gain amplifier, the RDAC 414 and the internal supply of the oscillator architecture 100. The switch transistor receives the constant reference voltage $V_{ref}$ from the unity gain amplifier and generates output voltages of the same value as the constant reference voltage $V_{ref}$.

The RDAC 414 is configured to receive the constant reference voltage $V_{ref}$ from the switch transistor 416 and DC and AC trim bits and generate three reference voltages $V_{ref0}$, $V_{ref1}$ and $V_{ref2}$ and a feedback signal to the unity gain amplifier 412. In the embodiment depicted in FIG. 4, the AC trim bits are "15:0," which means that the AC trim bits have 16 bits of control input and resolution. The DC trim bits are "3:0," which means that the DC trim bits have 4 bits of control input and resolution. In the embodiment depicted in FIG. 4, the RDAC 414 is connected to the ground.

The amplifier control circuit 418 receives an input signal from the internal supply and an output voltage $V_{1out}$ from the sequential power up circuit 342-1 (shown in FIG. 3) and generates a control signal for the unity gain amplifier 412. The amplifier control circuit 420 receives an output voltage $V_{2out}$ from the sequential power up circuit 342-2 (shown in FIG. 3) and generates another control signal for the unity gain amplifier 412. In the embodiment depicted in FIG. 4, the amplifier control circuit 420 is connected to the ground.

Turning back to FIG. 2, the current reference generator 210 of the reference generator 202 is configured to receive the bank of reference voltages (e.g., $V_{ref0}$, $V_{ref1}$ and $V_{ref2}$) from the voltage bank reference generator 208 and generates a bias voltage "$P_{bias}$" and a reference current "$I_{ref}$." The bias voltage $P_{bias}$ and the reference current $I_{ref}$ are output to the IQ oscillator 104 (shown in FIG. 1). In an embodiment, the reference current $I_{ref}$ is a second order temperature compensated current reference, which means that the variation of the current over the temperature has a parabolic shape. Because of the parabolic shape, a second order temperature compensated current reference has less variation.

Figure 5:
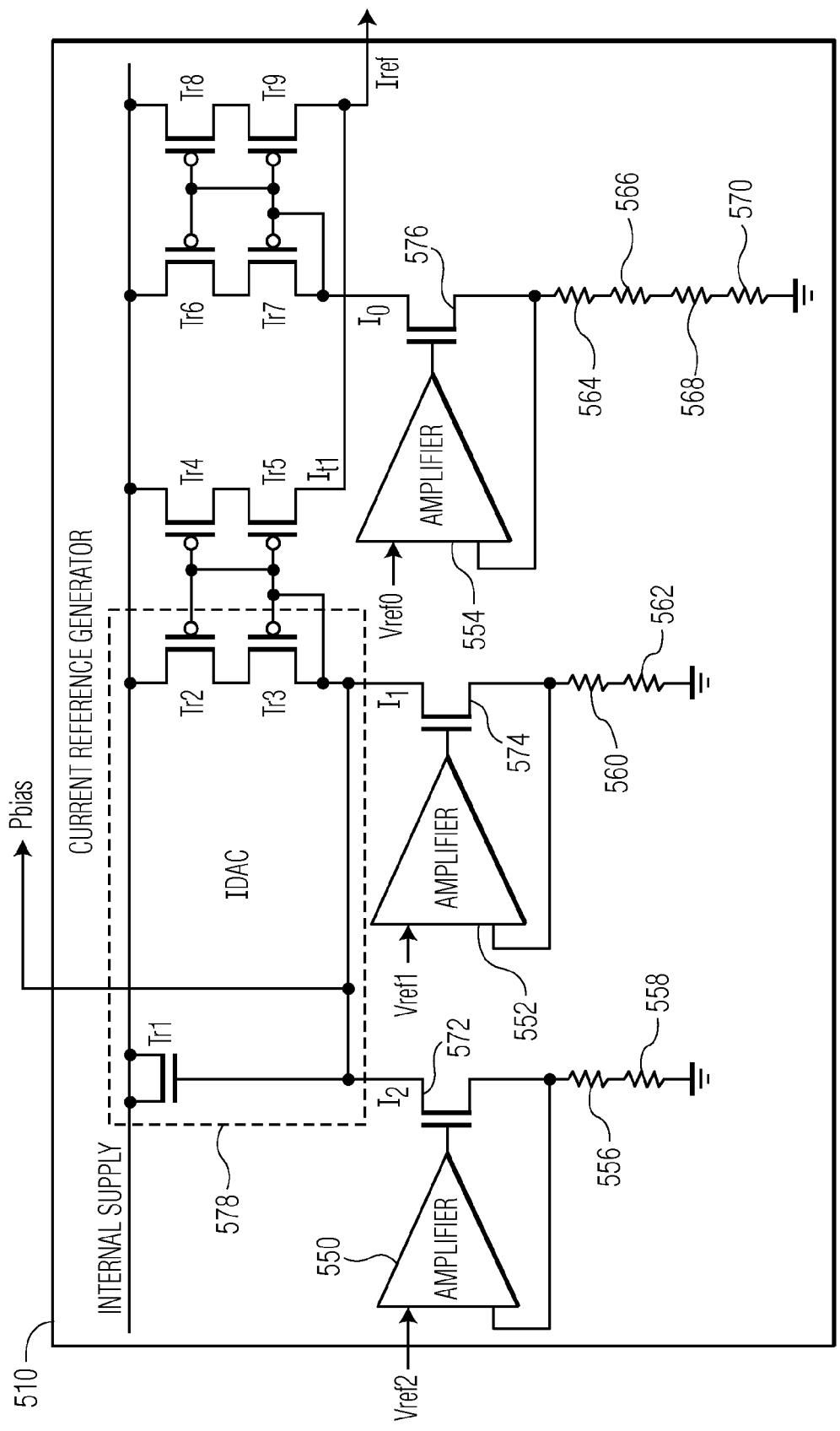
FIG. 5 depicts an embodiment of a current reference generator with a current digital-to-analog converter (IDAC) included in the reference generator of FIG. 2.

The current reference generator 210 may include a current digital-to-analog converter (IDAC) configured to convert a digital signal to the reference current $I_{ref}$. FIG. 5 depicts an embodiment of the current reference generator 210 of FIG. 2 having an IDAC. In the embodiment depicted in FIG. 5, a current reference generator 510 includes amplifiers 550, 552, 554, serially connected resistors 556, 558, serially connected resistors 560, 562, serially connected resistors 564, 566, 568, 570, transistors 572, 574, 576 and Tr4-Tr9, and an IDAC 578 that includes transistors Tr1-Tr3.

The amplifier 550, the serially connected resistors 556, 558 and the transistor 572 operate to convert the reference voltage $V_{ref2}$ from the RDAC 214 or 414 to a current $I_2$. Specifically, the amplifier 550 receives the reference voltage $V_{ref2}$ and a feedback signal from a node between the resistor 556 and the transistor 572 and generates an output signal to the gate terminal of the transistor 572, which outputs the current $I_2$ to the IDAC 578. In the embodiment depicted in FIG. 5, the resistor 558 is connected to the ground. The values of the serially connected resistors 556, 558 can be adjusted to generate different output current $I_2$.

The amplifier 552, the serially connected resistors 560, 562 and the transistor 574 operate to convert the reference voltage $V_{ref1}$ from the RDAC 214 or 414 to a current $I_1$. Specifically, the amplifier 552 receives the reference voltage $V_{ref1}$ and a feedback signal from a node between the resistor 560 and the transistor 574 and generates an output signal to the gate terminal of the transistor 574, which outputs the current $I_1$ to the IDAC 578. In the embodiment depicted in FIG. 5, the resistor 562 is connected to the ground. The values of the serially connected resistors 560, 562 can be adjusted to generate different output current $I_1$.

The amplifier 554, the serially connected resistors 564, 566, 568, 570 and the transistor 576 operate to convert the reference voltage $V_{ref0}$ from the RDAC 214 or 414 to a current $I_0$. Specifically, the amplifier 554 receives the reference voltage $V_{ref0}$ and a feedback signal from a node between the resistor 564 and the transistor 576 and generates an output signal to the gate terminal of the transistor 576, which outputs the current $I_0$ to the IDAC 578. In the embodiment depicted in FIG. 5, the resistor 570 is connected to the ground. The values of the serially connected resistors 564, 566, 568, 570 can be adjusted to generate different output current $I_0$.

The IDAC 578 operates to generate the bias voltage $P_{bias}$ and the reference current $I_{ref}$. As shown in FIG. 5, the IDAC 578 includes transistors Tr1-Tr3. The transistors Tr1, Tr2, Tr4, Tr6 and Tr8 are connected to the internal supply of the oscillator architecture 100. The transistor Tr2 is cascaded with the transistor Tr3. Both the transistor Tr2 and the transistor Tr3 are diode connected. The transistors Tr2 and Tr3 are connected to the transistors Tr4 and Tr5 to form a current mirror. The transistor Tr6 is cascaded with the transistor Tr7. Both the transistor Tr6 and the transistor Tr7 are diode connected. The transistors Tr6 and Tr7 are connected to the transistors Tr8 and Tr9 to form a current minor. The current $I_2$ and the current $I_1$ are combined to generate voltages across the diode connected transistors Tr2 and Tr3. The current mirror formed by the transistors Tr2-Tr5 generates a current $I_{t1}$. The current mirror formed by the transistors Tr6-Tr9 processes the current $I_0$ to generate a mirrored version of the current $I_0$. The mirrored version of the current $I_0$ and the current $T_{t1}$ are combined to produce the reference current $I_{ref}$.

Turning back to FIG. 1, the IQ oscillator 104 of the oscillator architecture 100 is configured to generate oscillation signals based on the reference signals from the reference generator 102. In the embodiment depicted in FIG. 1, the IQ oscillator 104 includes a sawtooth generator 112, turbo comparators 114-1, 114-2 and a set/reset (SR) logic 116. Although the IQ oscillator 104 is depicted and described with certain components and functionality, other embodiments of the IQ oscillator 104 may include fewer or more components to implement less or more functionality. For example, the IQ oscillator 104 may include only one of the turbo comparators 114-1, 114-2.

The sawtooth generator 112 of the IQ oscillator 104 generates two output signals that have 180 degree phase shift. In an embodiment, the sawtooth generator 112 outputs two signals A and B. The output signal A is 180 degrees out of phase from the output signal B. In an embodiment, the sawtooth generator 112 includes two timing capacitors (not shown) that are charged by the current reference $I_{ref}$ to generate voltages to set the timing for the output signals.

Each of the turbo comparators 114-1, 114-2 of the IQ oscillator 104 has a low power functional mode and a turbo functional mode. In the low power functional mode, each turbo comparator 114-1 or 114-2 operates with low power. In the turbo functional mode, each turbo comparator 114-1 or 114-2 operates with higher current to speed up the comparator process. In an embodiment, each turbo comparator 114-1 or 114-2 can generate a weak bias current and a stronger bias current. In the low power functional mode, the weak bias current is output by each turbo comparator 114-1 or 114-2. In the turbo functional mode, the combination of the stronger bias current and the weak bias current is output by each turbo comparator 114-1 or 114-2. Since the bias current is increased in the turbo functional mode, the turbo comparator 114-1 or 114-2 can have a faster responding speed in the turbo functional mode than in the low power functional mode. A conventional comparator sometimes turns off to save power. In contract to a conventional comparator, the turbo comparators 114-1 and 114-2 of the IQ oscillator 104 are never turned off. Specifically, instead of being turning off, each turbo comparator 114-1 or 114-2 is switched to the low power functional mode where all the biases are still on. Compared to the conventional comparator, the turbo comparators 114-1, 114-2 conserve power and have a faster response time.

In an embodiment, each of the turbo comparators 114-1, 114-2 is a transconductance/Gm based comparator. A transconductance/Gm based comparator is a comparator whose comparator function is based on the variance of the output current that is induced by an input voltage to the comparator. Compared to a voltage based comparator, a Gm based comparator has a faster response speed. The response speed of the IQ oscillator 104 is related to the response speed of the turbo comparators 114-1, 114-2. Because of the faster response speed of the Gm based turbo comparators 114-1, 114-2, the response speed of the IQ oscillator 104 is enhanced.

The SR logic 116 of the IQ oscillator 104 is configured to generate and/or enable clock signals for the turbo comparators 114-1, 114-2. The SR logic 116 may include logic gates such as NOR gates and OR gates. In an embodiment, the SR logic 116 is set to be always on.

Figure 6:
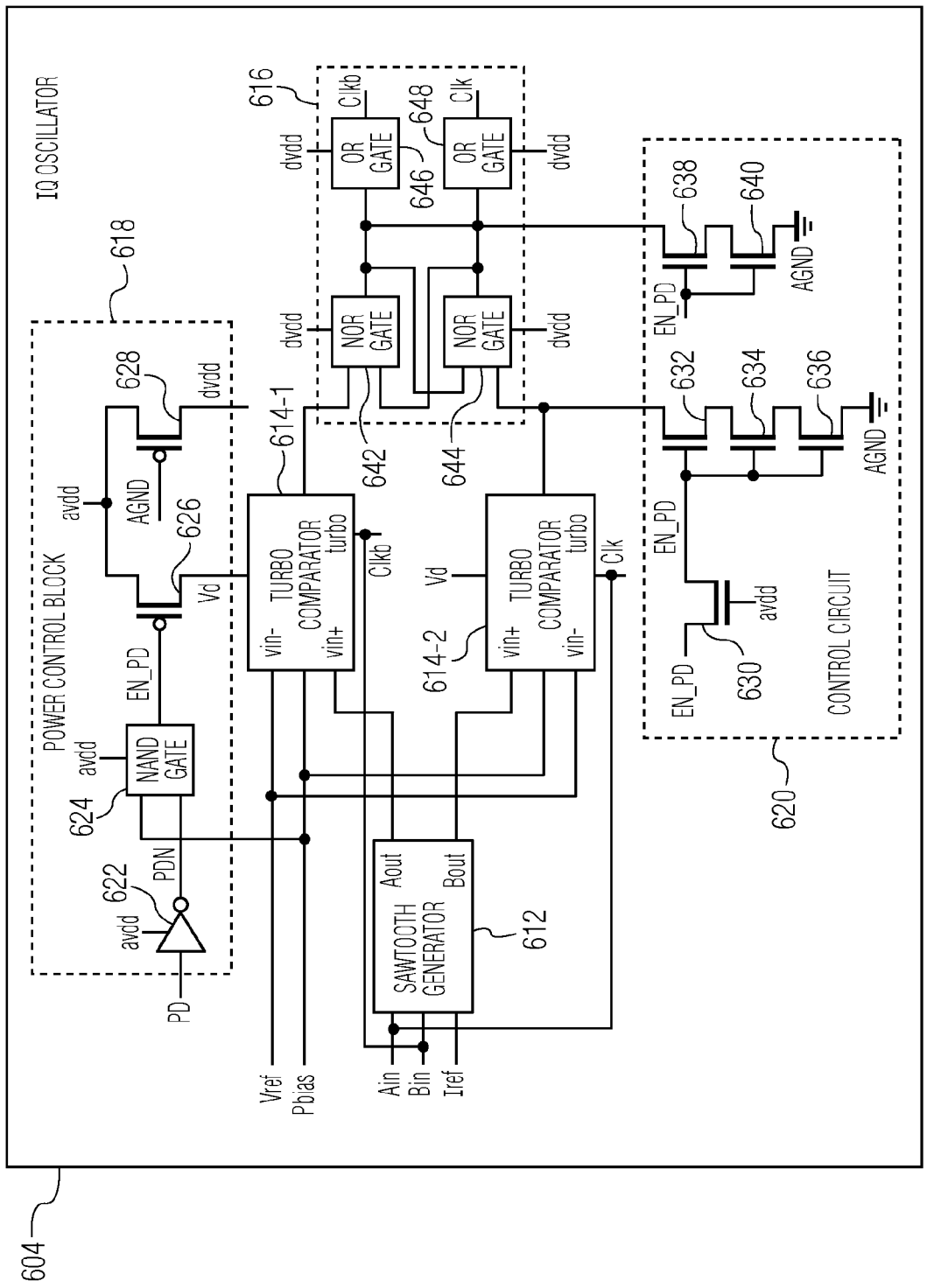
FIG. 6 depicts an embodiment of an IQ oscillator included in the oscillator architecture of FIG. 1.

FIG. 6 depicts an embodiment of the IQ oscillator 104 of FIG. 1. In the embodiment depicted in FIG. 6, an IQ oscillator 604 includes a power control block 618, a sawtooth generator 612, turbo comparators 614-1, 614-2, an SR logic 616 and a control circuit 620.

The power control block 618 is used to control power of other blocks of the IQ oscillator 604. In the embodiment depicted in FIG. 6, the power control block 618 includes an inverter 622, a NAND gate 624 and transistors 626, 628, which are supplied by a supply voltage for analog device (avdd). The inverter 622 inverts a power down (PD) signal into an inverted PD (PDN) signal. The PD signal is generated by a circuitry that uses the oscillator architecture 100. The NAND gate 624 converts the PDN signal and the bias voltage $P_{bias}$ from the current reference generator 210 or 510 into a power down enabling (EN_PD) signal. The transistor 626 receives the EN_PD signal at the gate terminal and avdd at the source terminal and generates an output voltage "Vd" at the drain terminal. The transistor 628 receives the voltage avdd at the source terminal and generates an output voltage "dvdd" at the drain terminal. The gate terminal of the transistor 628 is connected to the ground, which is referred to herein as the ground for analog device (AGND).

The sawtooth generator 612 is supplied by the output voltage Vd from the power control block 618. The sawtooth generator 612 receives the reference current $I_{ref}$ from the current reference generator 210 and two other input signals "$A_{in}$" and "$B_{in}$" and generates two output signals "$A_{out}$" and "$B_{out}$" that have 180 degree phase shift. The two input signals $A_{in}$ and $B_{in}$ are input control signals that control which output signal is generated by the sawtooth generator 612.

Each of the turbo comparators 614-1, 614-2 is supplied by the output voltage Vd from the power control block 618 and a turbo clock signal "Clkb" and a turbo clock signal "Clk," respectively. The turbo clock signal Clkb and the turbo clock signal Clk are 180 degree phase shifted. In the embodiment depicted in FIG. 6, Clk is connected to $A_{in}$ and Clkb is connected to $B_{in}$. Each of the turbo comparators 614-1, 614-2 receives the voltage $V_{ref}$ from the reference generator 102 or 202, e.g., from the voltage reference generator 206, and the bias voltage $P_{bias}$ from the current reference generator 210 and one of the output signals $A_{out}$ and $B_{out}$ from the sawtooth generator 612. Specifically, the turbo comparator 614-1 receives the voltage $V_{ref}$ at an input terminal "$V_{in-}$" and the signal $A_{out}$ at an input terminal "$V_{in+}$." The turbo comparator 614-2 receives the voltage $V_{ref}$ at an input terminal "$V_{in-}$" and the signal $B_{out}$ at an input terminal "$V_{in+}$."

Figure 7:
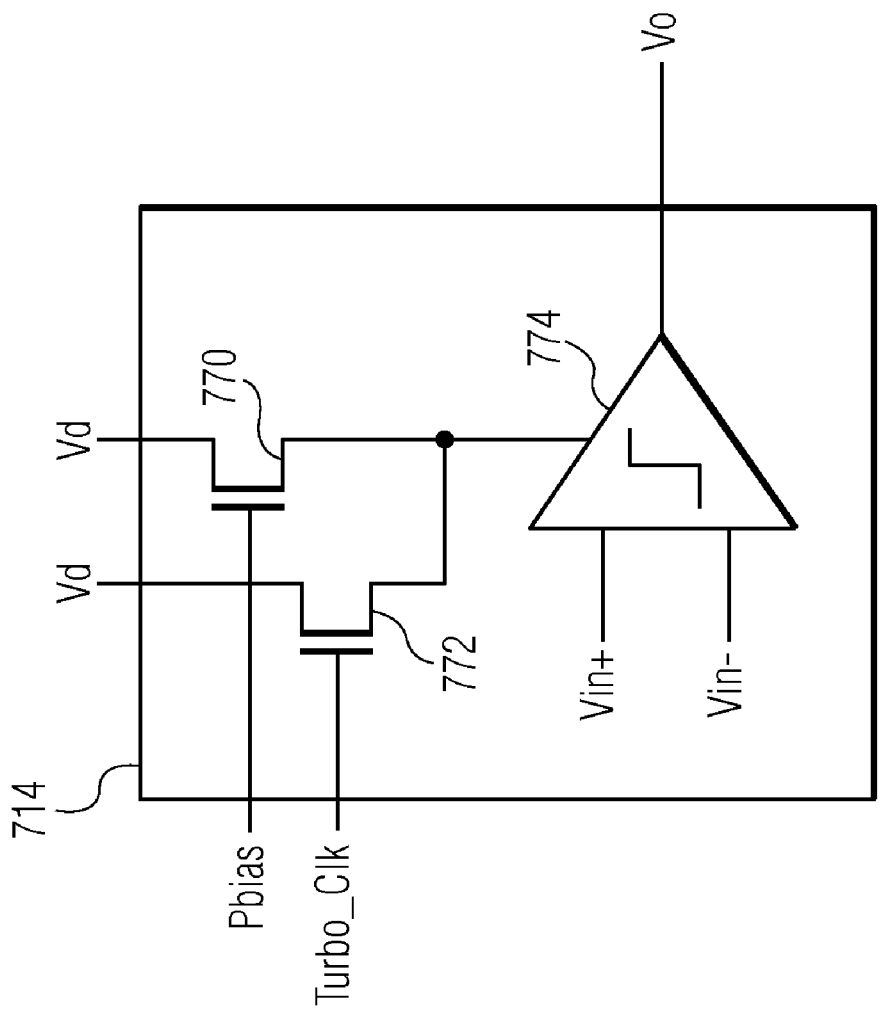
FIG. 7 depicts an embodiment of a turbo comparator of the IQ oscillator of FIG. 6.

FIG. 7 depicts an embodiment of one of the turbo comparators 614-1, 614-2. In the embodiment depicted in FIG. 7, a turbo comparator 714 includes transistor devices 770, 772 and a comparator 774. The transistor devices 770, 772 are supplied by the voltage Vd. In an embodiment, the transistor devices 770, 772 are supplied by the voltage avdd. The transistor device 770 receives the bias voltage $P_{bias}$ from the current reference generator 210 or 510. The transistor device 772 receives a clock signal "Turbo_Clk." The clock signal Turbo_Clk may be the clock signal Clk or the clock signal Clkb. The transistor devices 770, 772 generate a control signal for the comparator 774. The comparator 774 has an input terminal "$V_{in-}$" for receiving the voltage $V_{ref}$, an input terminal "$V_{in+}$" for receiving the signal $A_{out}$ or $B_{out}$ and an output terminal "$V_o$."

Figure 8:
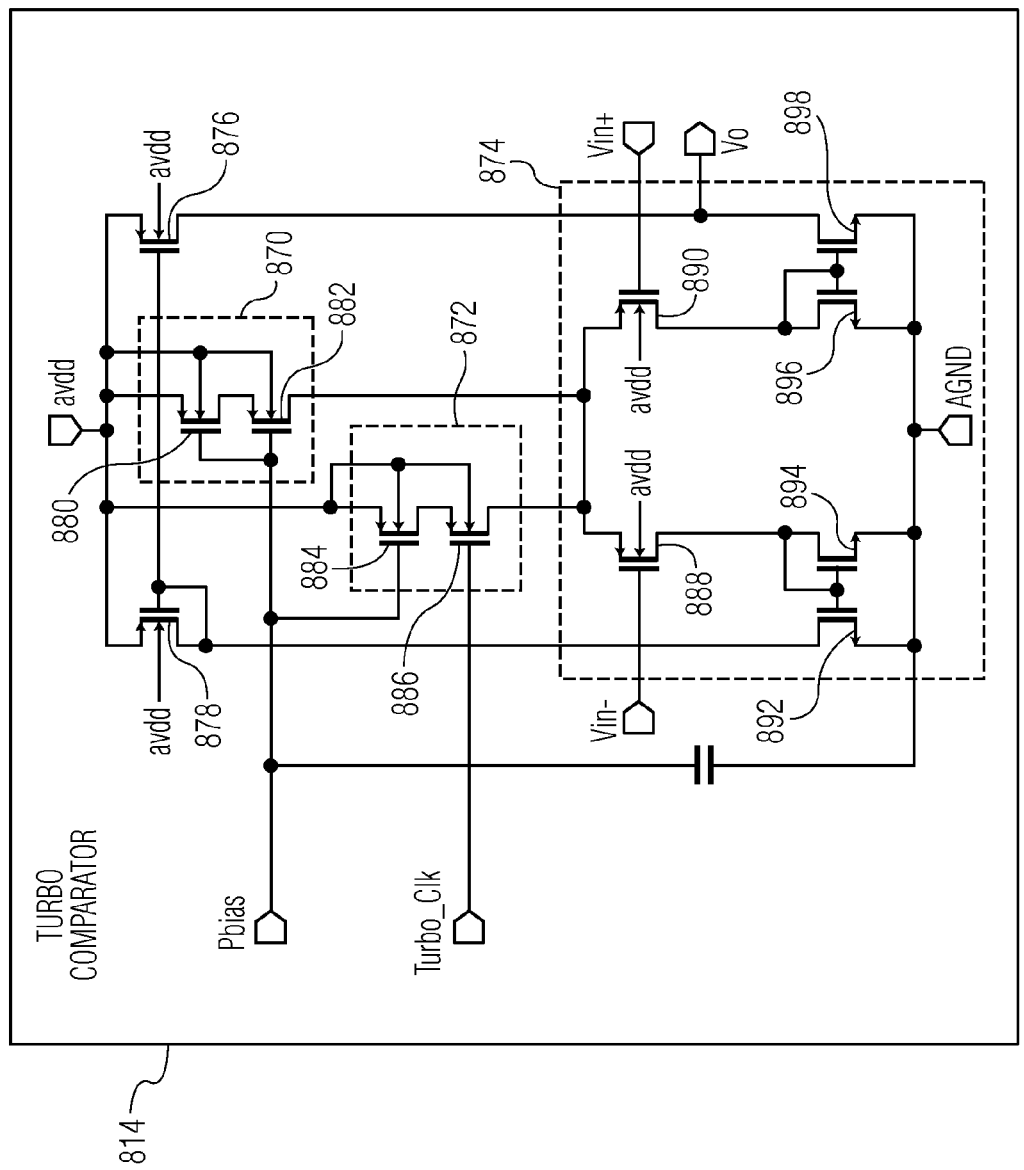
FIG. 8 shows a transistor level diagram of an embodiment of the turbo comparator of FIG. 7.

FIG. 8 shows a transistor level diagram of an embodiment of the turbo comparator 714 of FIG. 7. As shown in FIG. 8, a turbo comparator 814 includes transistor devices 870, 872, a comparator 874 and transistors 876, 878. The transistor device 870 includes transistors 880, 882. The transistor device 872 includes transistors 884, 886. The comparator 874 includes transistors 888-898.

Turning back to FIG. 6, the control circuit 620 is used to control the SR logic 616. In an embodiment, the control circuit 620 performs initiation of the SR logic 616. Specifically, the control circuit 620 forces the output of the turbo comparator 614-2 and the input of the NOR gate 644 to be grounded. In addition, the control circuit 620 also forces the input of the OR gates 646 and 648 to be grounded. In the embodiment depicted in FIG. 6, the control circuit 620 includes transistors 630-640. The transistor 630 receives the EN_PD signal from the power control block 618 at the source terminal or the drain terminal and the voltage avdd at the gate terminal and generates an output signal that is equal to the EN_PD signal at the drain terminal or the source terminal. The transistors 632, 634, 636 are serially connected. The transistors 632, 634, 636 receive the EN_PD signal at the gate terminals. The transistor 636 is connected to the AGND. The transistors 638, 640 are serially connected. The transistors 638, 640 receive the EN_PD signal from the power control block 618 at the gate terminals. The transistor 640 is connected to the AGND.

The SR logic 616 includes two NOR gates 642, 644 and two OR gates 646, 648, which are biased by the voltage dvdd from the power control block 618. The SR logic 616, which is always on, generates clocks signals Clk and Clkb for the turbo comparators 614-1, 614.

Figure 9:
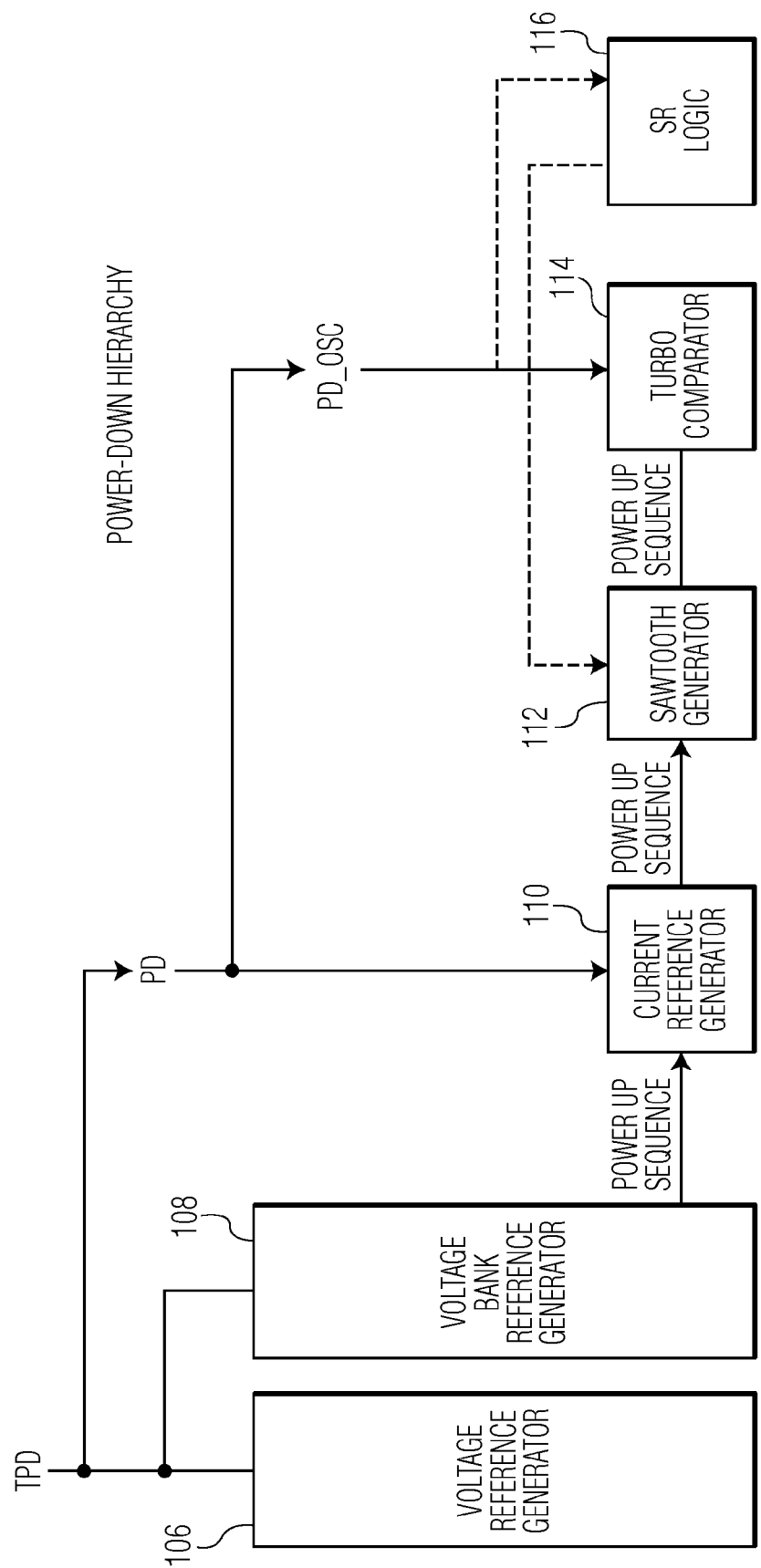
FIG. 9 shows an exemplary sequential/hierarchical power up and power down sequence for the oscillator architecture of FIG. 1.

To control the current consumption in power up and powering down the oscillator architecture 100, a sequential/hierarchical power up/power down mechanism is used to power up/down the oscillator architecture. An exemplary sequential/hierarchical power up and power down sequence for the oscillator architecture is shown in FIG. 9.

In the sequential/hierarchical powering up, the voltage reference generator 106 and the voltage bank reference generator 108 are powered up first when a Total Power Down (TPD) deassertion signal is received by the voltage reference generator 106 and the voltage bank reference generator 108. The current reference generator 110 is powered up second when a Power Down (PD) deassertion signal is received by the current reference generator 110. The IQ oscillator 104 is powered down third. Specifically, the sawtooth generator 112 is powered up and then at least one of the turbo comparators 114-1, 114-2 is powered up, for example, when a Power Down oscillator (PD_OSC) deassertion signal is received. In an embodiment, the deassertion signals are the falling edges of the corresponding signals.

In the sequential/hierarchical powering down, the voltage reference generator 106 and the voltage bank reference generator 108 are powered down first when a TPD assertion signal is received by the voltage reference generator 106 and the voltage bank reference generator 108. After the voltage reference generator 106 and the voltage bank reference generator 108 starts the power-down process, the current reference generator 110 is powered down when a PD assertion signal is received by the current reference generator 110. After the current reference generator 110 starts the power-down process, the IQ oscillator 104 is powered down when a PD_OSC assertion signal is received. Specifically, at least one of the turbo comparators 114-1, 114-2 is powered down first, and then the SR logic 116 is powered down, followed by the sawtooth generator 112. In an embodiment, the assertion signals are the rising edges of the corresponding signals.

In an embodiment, the oscillator architecture 100 is operated in four power management modes, which include an active mode, a standby mode, a dose mode and a sleep mode. Some examples of the properties of the active mode, the standby mode, the dose mode and the sleep mode are shown in FIG. 10. As shown in FIG. 10, in the active mode, the voltage reference generator 106, the voltage bank reference generator 108, the current reference generator 110 and the IQ oscillator 104 are powered on. In the standby mode, the voltage reference generator 106, the voltage bank reference generator 108 and the current reference generator 110 are powered on while the IQ oscillator 104 is powered off. In the dose mode, the voltage reference generator 106 and the voltage bank reference generator 108 are powered on while the current reference generator 110 and the IQ oscillator 104 are powered off. In the sleep mode, the voltage reference generator 106, the voltage bank reference generator 108, the current reference generator 110 and the IQ oscillator 104 are powered off. The clock signals for the turbo comparators 114-1, 114-2, such as the clock signal Clkb and Clk for the turbo comparators 614-1, 614-2, vary in the active mode, the standby mode, the dose mode and the sleep mode. As shown in FIG. 10, the clock signal Clkb and Clk are normal in the active mode and "L/H" in other modes, where L means logical low, which is 0V, and H means logical high, which is the supply voltage dvdd from the power control block 618.

Figure 11:
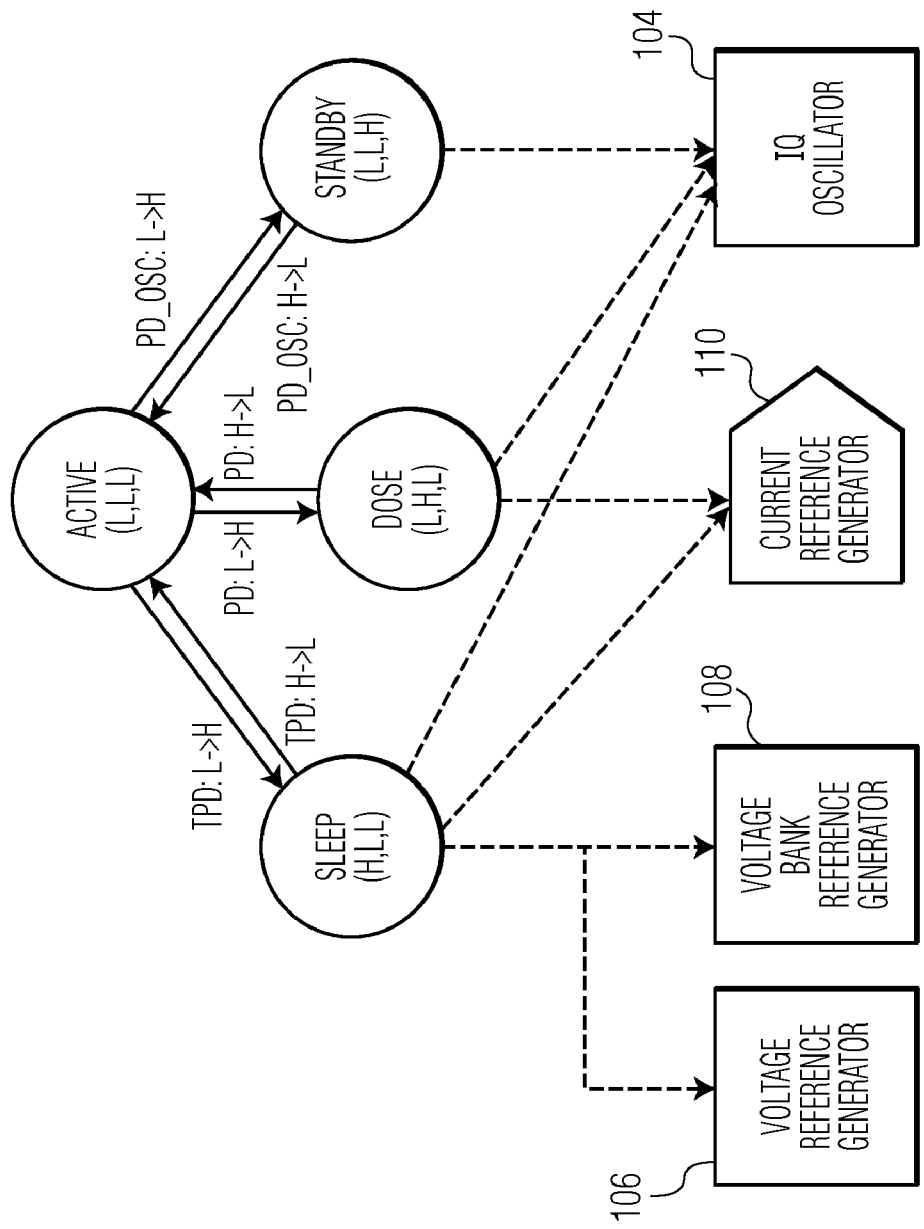
FIG. 11 illustrates an exemplary state diagram of the four power management modes in FIG. 10.

FIG. 11 illustrates an exemplary state diagram of the active mode, the standby mode, the dose mode and the sleep mode of the oscillator architecture 100. In the standby mode, the PD_OSC signal is logical high and the IQ oscillator 104 is turned off. In the dose mode, the PD signal is logical high and, in addition to the IQ oscillator 104, the current reference generator 110 is powered down. In the sleep mode, the TPD signal is logical high and the voltage reference generator 106 and the voltage bank reference generator 108 are further powered down. To switch from the active mode to the standby mode, the PD_OSC signal is switched from logical low to logical high. To switch from the active mode to the dose mode, the PD signal is switched from logical low to logical high. To switch from the active mode to the sleep mode, the TPD signal is switched from logical low to logical high.

FIG. 12 depicts exemplary parameters of the oscillator architecture 100. As depicted in FIG. 12, in the active mode, the TPD signal, the PD signal and the PD_OSC signal are logical low, the current "I_total" is 17.14 microamp (μA), the current "I_Osc" is 8.79 μA and the current "I_bias" is 9.59 μA. The current I_total is the total current of the oscillator architecture. The current I_Osc is the current drawn by the IQ oscillator 104. The current I_bias is the current drawn by the reference generator 102. In the standby mode, the TPD signal and the PD signal are logical low, the PD_OSC signal is logical high, the current I_total is 5.16 μA, the current I_Osc is 12.8 nanoamp (nA), the current I_bias is 5.15 μA, the startup time is 0.114 microsecond (μs), the frequency settling time is 0.81 μs and the peak current is 73.3 μA. The startup time is the duration of time for the IQ oscillator 104 to start oscillation. The frequency settling time is the duration of time for the oscillation to be accurate to the nominal accuracy of the oscillation. The peak current is the highest instantaneous current that the IQ oscillator 104 draws when the IQ oscillator 104 operates. In the dose mode, the TPD signal and the PD_OSC signal are logical low, the PD signal is logical low, the current I_total is 430 nA, the current I_Osc is 13.7 nA, the current I_bias is 417 nA, the startup time is 1.232 μs, the frequency settling time is 1.95 μs and the peak current is 106 μA. In the sleep mode, the PD_OSC signal and the PD signal are logical low, the TPD signal is logical high, the current I_total is 23.5 nA, the current I_Osc is 11.94 nA, the current I_bias is 11.6 nA, the startup time is 0.382 μs, the frequency settling time is 1.8 μs and the peak current is 158 μA. As shown in FIG. 12, the startup time and the frequency settling time of the oscillator architecture are in the millisecond range. In a highly accurate oscillator, a faster response time usually comes with higher current consumption in the reference generators and comparators. However, the distributed voltage reference generator 106 and the turbo mode comparators 114-1, 114-2 can be combined to achieve an accurate oscillator with a sub-microsecond response time and micro-ampere current consumption. In some embodiment, the distributed voltage reference generator 106, the turbo mode comparators 114-1, 114-2 and the power up/power down sequence described with respect to FIG. 9 can be combined to achieve an accurate oscillator with a sub-microsecond response time and micro-ampere current consumption.

Figure 13:
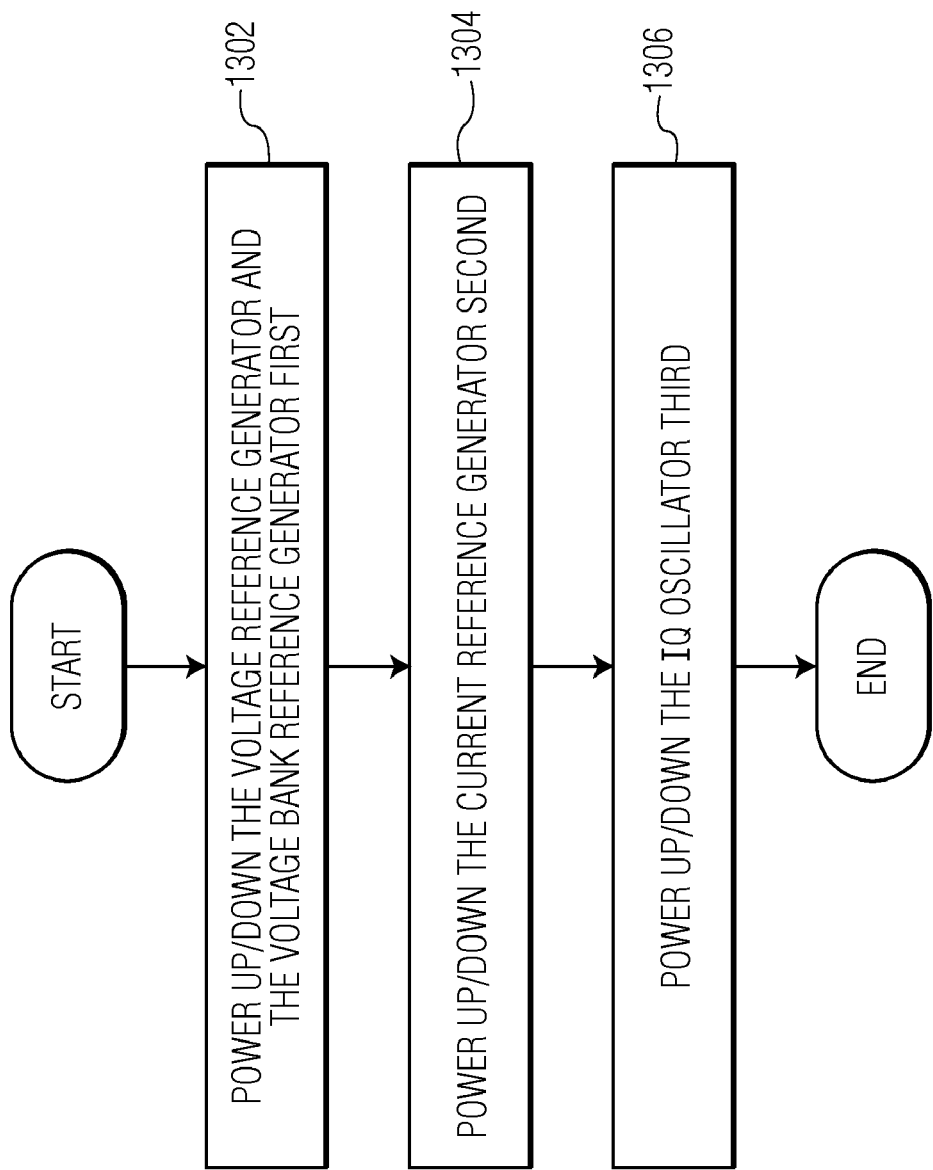
FIG. 13 is a process flow diagram of a method for sequentially powering up/down an oscillator architecture in accordance with an embodiment of the invention.

FIG. 13 is a process flow diagram of a method for sequentially powering up/down an oscillator architecture in accordance with an embodiment of the invention. The oscillator architecture includes a reference generator and an IQ oscillator. The reference generator includes a voltage reference generator comprising a distributed start-up circuitry that includes multiple start-up circuits, a voltage bank reference generator and a current reference generator. The IQ oscillator includes a sawtooth generator, two turbo comparators and a SR logic. The oscillator architecture may be similar to or same as the oscillator architecture 100 depicted in FIG. 1. At block 1302, the voltage reference generator and the voltage bank reference generator are powered up/down first. At block 1304, the current reference generator is powered up/down second. At block 1306, the IQ oscillator is powered up/down third.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. An oscillator architecture comprising:
a reference generator configured to generate reference signals, wherein the reference generator comprises a distributed start-up circuitry that includes a plurality of start-up circuits; and
an in-phase/quadrature (IQ) oscillator configured to generate oscillation signals based on the reference signals, wherein the IQ oscillator comprises at least one turbo comparator having a low power functional mode and a turbo functional mode.

2. The oscillator architecture of claim 1, wherein the reference generator comprises a voltage reference generator configured to generate a constant reference voltage, wherein the voltage reference generator comprises the distributed start-up circuitry.

3. The oscillator architecture of claim 2, wherein the reference generator further comprises:
a voltage bank reference generator configured to receive the constant reference voltage from the voltage reference generator and generate a bank of reference voltages; and
a current reference generator configured to receive the bank of reference voltages from the voltage bank reference generator and generate a bias voltage and a reference current.

4. The oscillator architecture of claim 3, wherein the reference current is a second order temperature compensated current reference.

5. The oscillator architecture of claim 3, wherein the current reference generator comprises a current digital-to-analog converter configured to convert a digital signal to the reference current.

6. The oscillator architecture of claim 3, wherein the voltage bank reference generator comprises:
a unity gain amplifier configured to receive the constant reference voltage from the voltage reference generator and generate an output voltage having same value as the constant reference voltage; and a
resistor string digital to analog converter configured to receive the output voltage from the unity gain amplifier and generate the bank of reference voltages.

7. The oscillator architecture of claim 1, wherein the at least one turbo comparator comprises two turbo comparators having the low power functional mode and the turbo functional mode.

8. The oscillator architecture of claim 7, wherein the two turbo comparators are transconductance based comparators.

9. The oscillator architecture of claim 3, wherein the IQ oscillator further comprises:
a sawtooth generator configured to generate two output signals that have 180 degree phase shift, wherein the two output signals are output to the at least one turbo comparator; and
a set/reset logic configured to generate clock signals for the at least one turbo comparator.

10. The oscillator architecture of claim 9, wherein a sequential power up sequence is used to power up the oscillator architecture, wherein the voltage reference generator and the voltage bank reference generator are powered up first, wherein the current reference generator is powered up second, and wherein the sawtooth generator and the at least one turbo comparator are powered up third.

11. The oscillator architecture of claim 9, wherein a sequential power down sequence is used to power down the oscillator architecture, wherein the voltage reference generator and the voltage bank reference generator are powered down first, wherein the current reference generator is powered down second, and wherein the IQ oscillator is powered down third.

12. The oscillator architecture of claim 11, wherein the at least one turbo comparator is powered down first, the set/reset logic is powered down second and the sawtooth generator is powered down third.

13. The oscillator architecture of claim 3, the oscillator architecture is operated in four power management modes, which include an active mode, a standby mode, a dose mode and a sleep mode, wherein in the active mode, the voltage reference generator, the voltage bank reference generator, the current reference generator and the IQ oscillator are powered on, wherein in the standby mode, the voltage reference generator, the voltage bank reference generator and the current reference generator are powered on while the IQ oscillator is powered off, wherein in the dose mode, the voltage reference generator and the voltage bank reference generator are powered on while the current reference generator and the IQ oscillator are powered off, and wherein in the sleep mode, the voltage reference generator, the voltage bank reference generator, the current reference generator and the IQ oscillator are powered off.

14. An oscillator architecture comprising:
a reference generator comprises:
a voltage reference generator configured to generate a constant reference voltage, wherein the voltage reference generator comprises a distributed start-up circuitry that includes a plurality of start-up circuits; a voltage bank reference generator configured to receive the constant reference voltage from the voltage reference generator and generate a bank of reference voltages; and
a current reference generator configured to receive the bank of reference voltages from the voltage bank reference generator and generate a bias voltage and a reference current; and
an in-phase/quadrature (IQ) oscillator configured to generate oscillation signals based on the bias voltage and the reference current, wherein the IQ oscillator comprises:
a sawtooth generator configured to generate two output signals that have 180 degree phase shift;
two turbo comparators having a low power functional mode and a turbo functional mode, wherein the two turbo comparators are configured to receive the two output signals from the sawtooth generator, and wherein the two turbo comparators are transconductance based comparators; and
a set/reset logic configured to generate clock signals for the two turbo comparators.

15. The oscillator architecture of claim 14, wherein the voltage bank reference generator comprises:
a unity gain amplifier configured to receive the constant reference voltage from the voltage reference generator and generate an output voltage having same value as the constant reference voltage; and a resistor string digital to analog converter configured to receive the output voltage from the unity gain amplifier and generate the bank of reference voltages.

16. The oscillator architecture of claim 14, wherein the current reference generator comprises a current digital-to-analog converter configured to convert a digital signal to the reference current, and wherein the reference current is a second order temperature compensated current reference.

17. The oscillator architecture of claim 14, wherein a sequential power up sequence is used to power up the oscillator architecture, wherein the voltage reference generator and the voltage bank reference generator are powered up first, wherein the current reference generator is powered up second, and wherein the sawtooth generator and the at least one turbo comparator are powered up third.

18. The oscillator architecture of claim 14, wherein a sequential power down sequence is used to power down the oscillator architecture, wherein the voltage reference generator and the voltage bank reference generator are powered down first, wherein the current reference generator is powered down second, and wherein the IQ oscillator is powered down third.

19. The oscillator architecture of claim 14, the oscillator architecture is operated in four power management modes, which include an active mode, a standby mode, a dose mode and a sleep mode, wherein in the active mode, the voltage reference generator, the voltage bank reference generator, the current reference generator and the IQ oscillator are powered on, wherein in the standby mode, the voltage reference generator, the voltage bank reference generator and the current reference generator are powered on while the IQ oscillator is powered off, wherein in the dose mode, the voltage reference generator and the voltage bank reference generator are powered on while the current reference generator and the IQ oscillator are powered off, and wherein in the sleep mode, the voltage reference generator, the voltage bank reference generator, the current reference generator and the IQ oscillator are powered off.

20. A method for sequentially powering up/down an oscillator architecture, wherein the oscillator architecture comprises a reference generator and an in-phase/quadrature (IQ) oscillator, wherein the reference generator comprises a voltage reference generator comprising a distributed start-up circuitry that includes a plurality of start-up circuits, a voltage bank reference generator and a current reference generator, and wherein the IQ oscillator comprises a sawtooth generator, two turbo comparators and a set/reset logic, the method comprising:
powering up/down the voltage reference generator and the voltage bank reference generator first;
powering up/down the current reference generator second; and
powering up/down the IQ oscillator third.

* * * * *